United States Patent
Gueguen (10) Patent No.: US 7,200,797 B2
(45) Date of Patent: Apr. 3, 2007

(54) METHOD AND DEVICE FOR OPTIMISING, UNDER PERFORMANCE CONSTRAINT, THE SIZE OF BLOCKS OF CODED DATA

(75) Inventor: Arnaud Gueguen, Rennes (FR)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 384 days.

(21) Appl. No.: 10/091,279

(22) Filed: Mar. 6, 2002

(65) Prior Publication Data

US 2002/0159429 A1     Oct. 31, 2002

(30) Foreign Application Priority Data

Mar. 19, 2001  (FR) ................... 01 03787

(51) Int. Cl.
  *H03M 13/03*  (2006.01)
(52) U.S. Cl. .................. 714/794; 714/787; 714/788
(58) Field of Classification Search ............... 714/794, 714/787, 788
  See application file for complete search history.

(56) References Cited

U.S. PATENT DOCUMENTS

| | | | |
|---|---|---|---|
| 5,761,248 A | 6/1998 | Hagenauer et al. | |
| 6,044,116 A | 3/2000 | Wang | |
| 6,182,261 B1 | 1/2001 | Haller et al. | |
| 6,233,709 B1* | 5/2001 | Zhang et al. | 714/774 |
| 6,289,486 B1* | 9/2001 | Lee et al. | 714/788 |
| 6,430,722 B1* | 8/2002 | Eroz et al. | 714/755 |
| 6,477,679 B1* | 11/2002 | Such et al. | 714/755 |
| 6,477,681 B1* | 11/2002 | Taipale et al. | 714/795 |
| 6,484,283 B2* | 11/2002 | Stephen et al. | 714/786 |
| 6,563,877 B1* | 5/2003 | Abbaszadeh | 375/242 |
| 6,829,313 B1* | 12/2004 | Xu | 375/341 |
| 2002/0194555 A1* | 12/2002 | Gueguen | 714/704 |

FOREIGN PATENT DOCUMENTS

| | | |
|---|---|---|
| DE | 197 36 676 | 12/1998 |
| EP | 1 128 589 | 8/2001 |
| FR | 2 747 255 | 10/1997 |

* cited by examiner

*Primary Examiner*—Joseph D. Torres
(74) *Attorney, Agent, or Firm*—Oblon, Spivak, McClelland, Maier & Neustadt, P.C.

(57) ABSTRACT

A method of optimizing the size of blocks of coded data intended to be subjected to an iterative decoding process, a maximum error rate of the iterative decoding process being fixed in advance, in which there are sought, among a plurality of block sizes (N/k) which are submultiples of the normal block size by an integer factor (k) greater than or equal to 1 and a plurality of integers giving the maximum number of iterations that can be effected by the said iterative decoding on a block, (1) a submultiple size, and (2) a maximum number of iterations such that they are compatible with the maximum error rate, and such that the mean number of iterations that will be applied by the iterative decoding process on a block of submultiple size is minimized.

13 Claims, 8 Drawing Sheets

N $n^{(1)}_{iterations} = 3$

N/10

$n^{(10)}_{iterations} = 4$ $\bar{n}^{(10)}_{iterations} = 2.6$

METHOD AND DEVICE FOR OPTIMISING, UNDER PERFORMANCE CONSTRAINT, THE SIZE OF BLOCKS OF CODED DATA

BACKGROUND OF THE INVENTION

1. Field of the Invention

The present invention concerns a method of optimising the size of a block of coded data intended to be subjected to an iterative decoding, such as the one implemented in a turbodecoder or a turboequaliser. It applies in particular to the so-called third generation telecommunications systems.

2. Discussion of the Background

The concept of turbocode was introduced by C. Berrou, A. Glavieux and P. Thitimajshima in their article "Near Shannon Limit Error-Correcting Coding and Decoding: Turbocodes", ICC-1993, Conference Proceedings, pp. 1064–1070, and has, as is known, been subject to many developments.

It will be recalled that turbocoding results from the concatenation of elementary codes separated by interleaving steps. The elementary codes can be of different types: recursive systematic codes (denoted RSC) for convolutional turbocodes or block codes (RS, BCH) for block turbocodes. The latter were described by R. Pyndiah, P. Combelles and P. Adde in an article entitled "A very low complexity block turbo decoder for product codes", published in Proc. of IEEE Globecom, pp. 101–105, 1996. Different types of concatenation have been envisaged such as parallel concatenation, in which the same information is coded separately by each coder after having been interleaved and serial concatenation in which the output of each coder is interleaved before being coded by the following coder. For a detailed description, reference can be made, for parallel concatenation, to the aforementioned article by Berrou et al. and, for serial concatenation, to the article by S. Benedetto, G. Montorsi, D. Divsalar and F. Pollara, "Serial concatenation of interleaved codes: Performance analysis, design and iterative decoding ", JPL TDA Progr. Rep., Vol. 42–126, August 1996.

The decoding of a turbocode is conventionally effected by means of an iterative process also referred to as turbodecoding, consisting of a series of elementary decoding operations, each elementary decoding operation receiving weighted input values and supplying weighted output values, relating respectively to the input and, for a serial turbocode, to the output of the corresponding elementary coding operation. The weighted input and output values represent the probabilities of the binary or M-ary symbols at the input and (for serial turbocodes) at the output of the corresponding elementary coder. Deinterleaving and interleaving operations take place as a function of the interleaving operations performed at coding and enable each elementary decoding operation to take account of the data in the same order as that at the input of the corresponding coding operation.

Figure 1A:
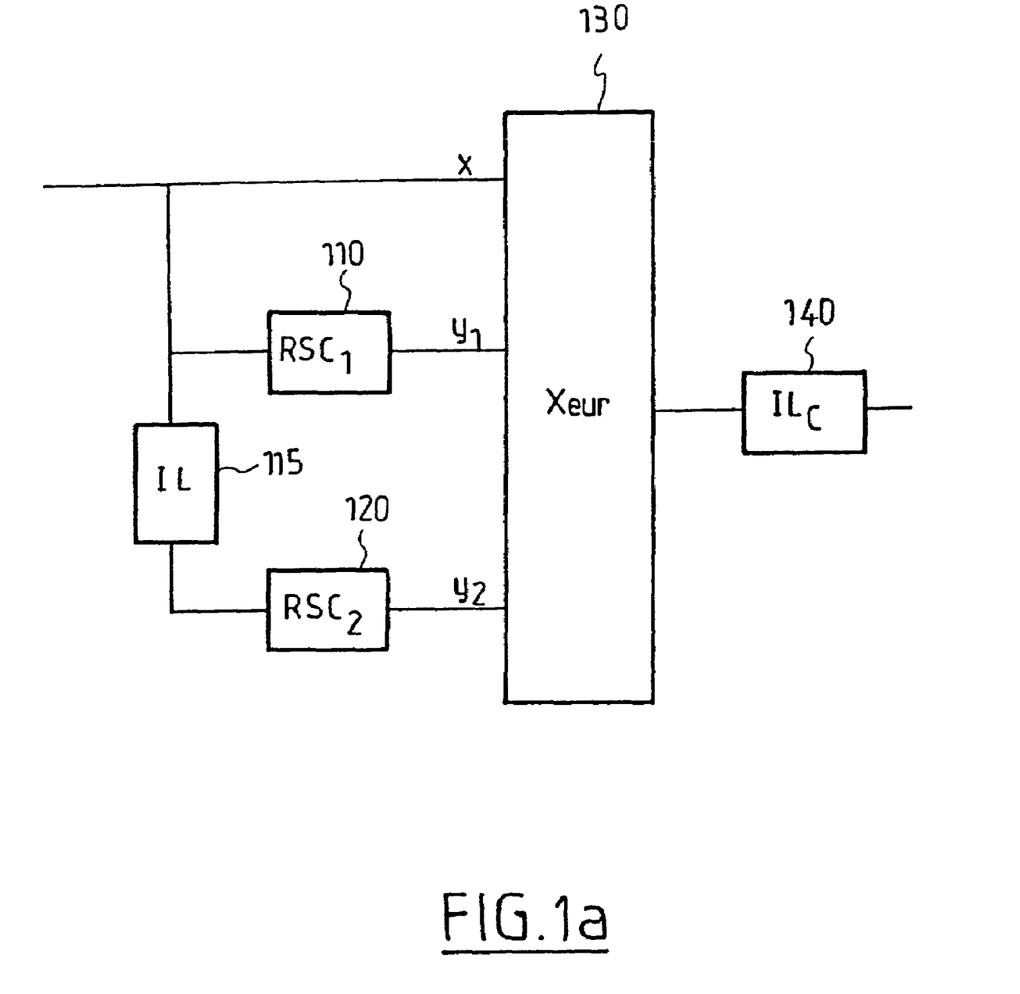
FIG. 1a illustrates schematically an example of a known turbocoder of the state of the art.

FIG. 1$a$ illustrates schematically an example of a turbocoder. The turbocoder depicted is a parallel turbocoder of dimension 2. The information x, in the form of a block of data, is coded by a first elementary coder 110 in order to supply a first output $y_1$ and by a second elementary coder 120, after having been interleaved by the interleaver 115, in order to supply a second output $y_2$. The systematic information is multiplexed at 130 with the coded information $y_1$ and $y_2$ before being interleaved by a channel interleaver 140.

Figure 1B:
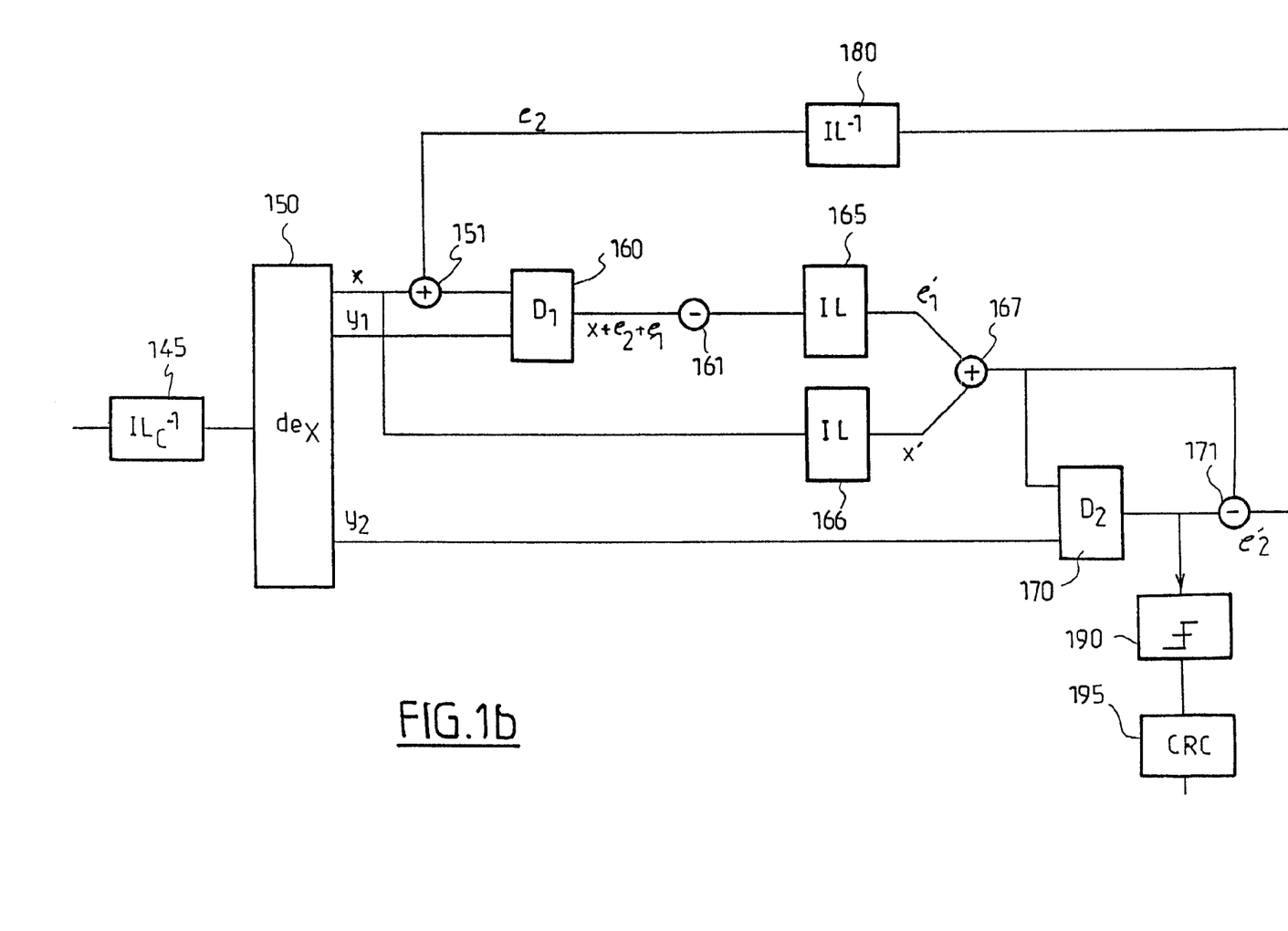

On reception, the information is decoded by means of the turbodecoder depicted in FIG. 1$b$. After deinterleaving in the channel deinterleaver 145, the information x, $y_1$, and $y_2$ is demultiplexed by the demultiplexer 150. The elementary decoders 160 and 170, for example of the Log MAP type, correspond and respectively to the elementary coders 110 and 120. The decoder 160, of the weighted input and output type, receives a priori information on x and the coded information $y_1$, in order to derive therefrom a posteriori information on x. The difference between the a posteriori information and the a priori information is called extrinsic information. The a priori information on x and the extrinsic information $e_1$ supplied by the first decoder are interleaved by interleavers 165 and 166 and then added at 167 in order to supply to the decoder 170 new a priori information on x (or more precisely on x', the interleaved version of x). The decoder 170 estimates, from this a priori information and the coded information $y_2$, a posteriori information on x'. The intrinsic information $e'_2$ is derived therefrom by difference in 171 before being deinterleaved in the deinterleaver 180 and is then added at 151 to the systematic information in order to supply new a priori information on x to the decoder 160. The decoding steps are then repeated, for a predetermined number of iterations $n_{iterations}$. The flexible values at the output of the decoder 170 are submitted to a decision device 190 in order to supply hard values. An error correction check 195 operating on the output of 190 determines whether the decoded block is error-free and, in the affirmative, interrupts the iterations without having to await the predetermined number $n_{iterations}$. Alternatively, in order to decide on the stoppage of the iterations, the turbodecoder can use, instead of a CRC, another stoppage criterion on the weighted values, such as the one disclosed, for example, in the article by J. Hagenauer et al. entitled "Iterative decoding of binary block and convolutional codes", IEEE Transactions on Information Theory, vol. 42, pp. 429–445, published in March 1996, or in the article by M. Moher entitled "Decoding via cross entropy minimization", in Proc. IEEE Globecom Conf., Houston, Tex., pp. 809–813, published in December 1993.

The principle of iterative decoding was transposed to equalisation by C. Douillard et al. in an article entitled "Iterative Correction of Intersymbol Interference: Turbo-equalization", published in European Trans. Telecomm., Vol. 6, No 5, September/October, pages 507–511. This iterative equalisation method, also referred to as turboequalisation, starts from the principle that a channel affected by intersymbol interference (ISI) can be considered to be equivalent to a convolutional coder and consequently the concatenation of a channel coder, an interleaver and a transmission channel can itself be considered to be the equivalent of a turbocoder.

Figure 2A:
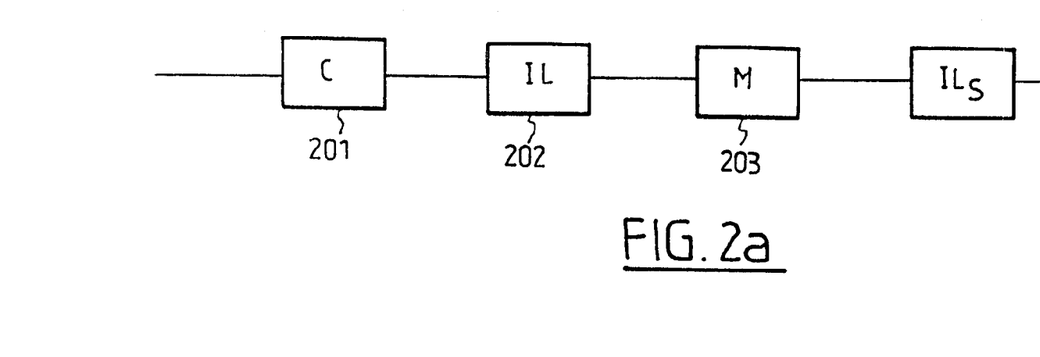
FIG. 2a illustrates schematically an example of a known transmitter of the state of the art.
Figure 2B:
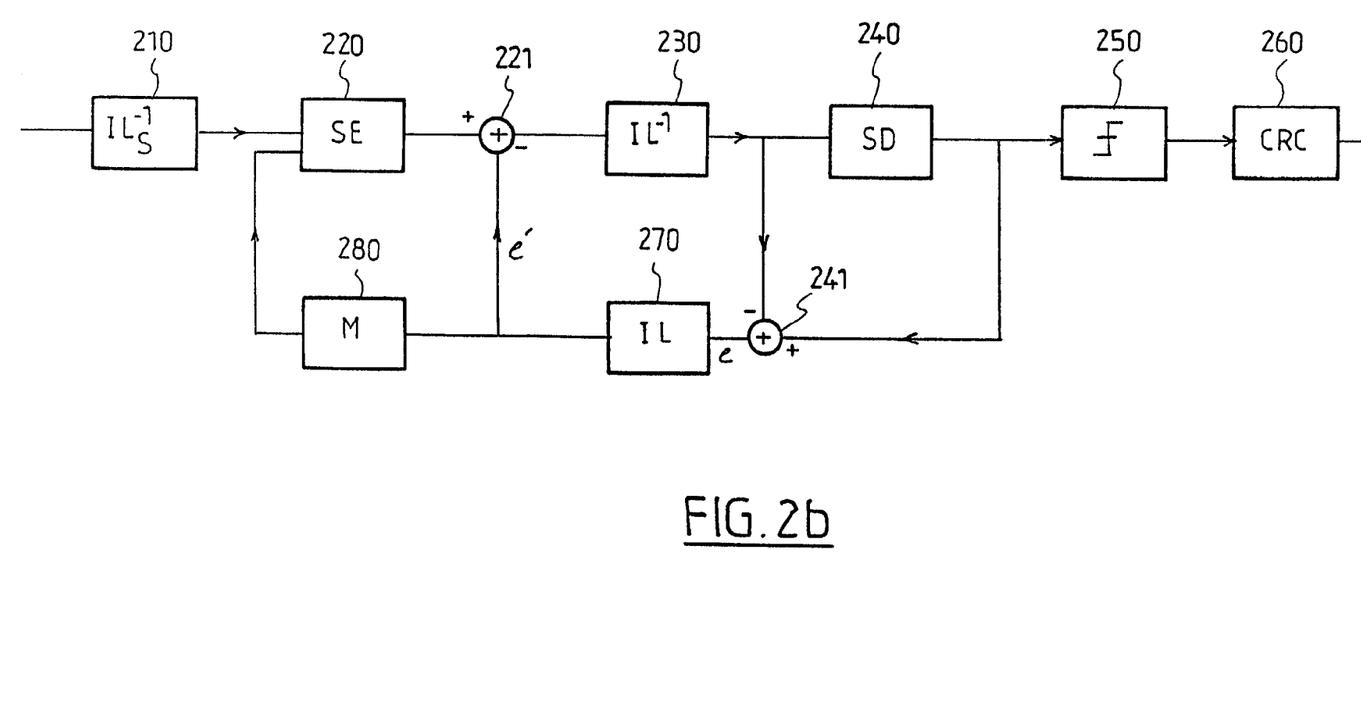
FIG. 2b illustrates schematically an example of a known turboequaliser of the state of the art.

FIG. 2$b$ illustrates schematically the structure of a turboequaliser. It will be assumed that the data were, on the same side as the transmitter depicted in FIG. 2$a$, the subject of channel coding in a coder 201 before being interleaved in an interleaver 202 and subjected to M-ary to symbol mapping in the modulator 203. The data are transmitted in the form of a block of symbols interleaved by the channel interleaver 204. The turboequaliser comprises first of all a cannel deinterleaver 210 followed by a weighted output equaliser of the Log-MAP type supplying flexible values of coded data. These data are deinterleaved in the deinterlever 230 before being decoded by a decoder 240 of the Log-MAP type with weighted output. The flexible values issuing from the decoder 240 are submitted to a decision device 250 supplying the corresponding hard values. The weighted value at the input of the decoder 240 are subtracted from the output values at 241 in order to supply extrinsic information e to interleaver 270. After interleaving, the extrinsic information is on the one hand subtracted in 221 at the output of the equaliser 220 and on the other hand remodulated by modulator 280 before being transmitted to the equaliser. From the symbols received and the remodulated extrinsic information, the equaliser 220 proceeds with a new a priori estimation. The turboequaliser thus carries out a predetermined number of iterations on a block of symbols. An error correction check 260 at the output of 250 diagnoses the presence or absence of errors, the iteration process is interrupted without the iterations without having to wait for the predetermined number $n_{iterations}$. The stoppage criterion can alternatively relate to the weighted values, as seen above.

It should be noted in relation to the design that both for turbocoding and for turboequalisation the iterations can be carried out one after the other within the same processor or in dedicated circuits arranged in a pipeline, each being responsible for an iteration of given rank.

In the cases of turbocoding and turboequalisation, the performance in terms of bit error rate (BET) or packet error rate (PET) is all the better, the greater the length of the size N of the internal interleaver (IL). This is because the increase in the size of the internal interleaver, that is to say the size of the block on which the interleaving is carried out, improves both the Hamming weight distribution of the turbocode and the efficacy of the iterative decoding. The interleaving gain varies according to the type of turbocode. Hereinafter the term "performance" will be used indifferently for the BET or the PET on the decoded data.

Figure 3:
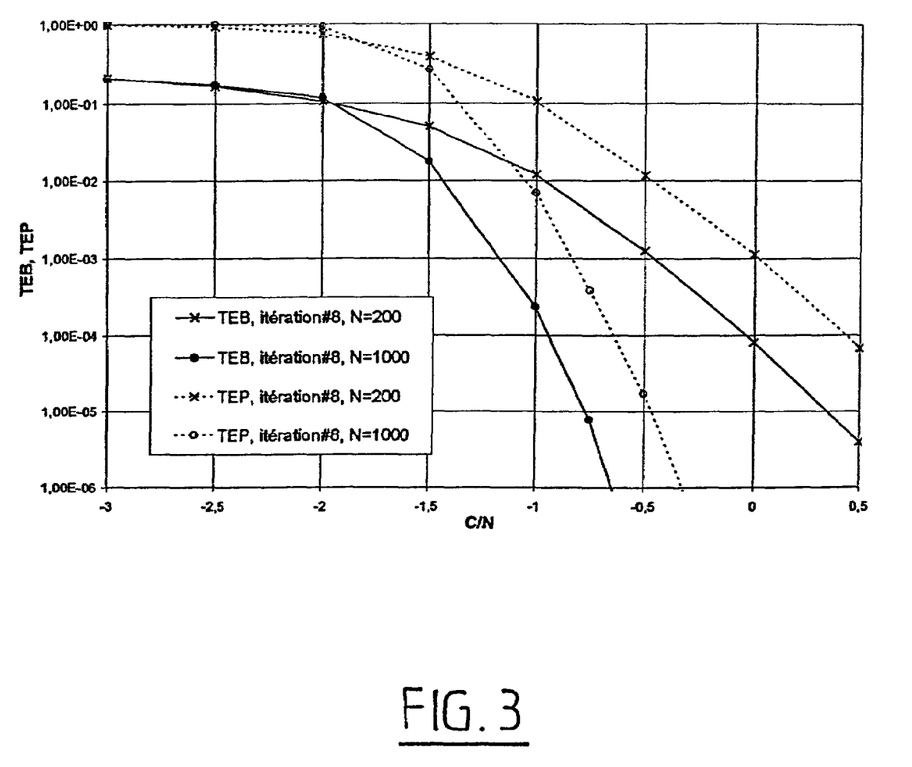
FIG. 3 shows the interleaving gain of the turbocoder of FIG. 1a changing from a first block size to a second block size.

FIG. 3 shows, by way of example, the interleaving gain for the turbocoder of FIG. 1a, whose elementary coders are RSC (Recursive Systematic Convolutional) coders of polynomials $(13,15)_{oct}$, when the size N of the block changes from 200 to 1000.

When the latency time of the receiver, defined as the time at the end of which a block of data or symbols received is actually available in decoded form, is a critical parameter of the application, and is known from the state of the art as using low values of N.

The latency time at the receiver can in fact be written:

$$T_{latency} = T_{rec} + \frac{N}{D_d} \cdot n_{iterations} \qquad (1)$$

where $D_d$ is the decoding rate per iteration and $T_{rec}$ is the time necessary for obtaining the data of a block in deinterleaved form.

A reduction in the latency time can be achieved by reducing the size of the blocks, at the cost however, as seen in FIG. 3, of a correlative reduction in the performance of the system. One problem is to determine, without degradation of the performance, a block size N making it possible to obtain a lower latency time than in the state of the art.

When the iterative decoding is dealt with by a fast processor, the critical resource is no longer the latency time but rather the energy expended for performing the calculation, itself also depending on the number of operations involved in the decoding.

The general problem is to determine, without degradation of performance, a block size N allowing a lower expenditure of resources than in the state of the art.

SUMMARY OF THE INVENTION

The solution afforded by the invention is defined by a method of optimising the size of blocks of coded data intended to be subjected to iterative decoding, a maximum error rate at the output of the iterative decoding being fixed in advance, the method seeking, amongst a plurality of block sizes which are submultiples of the normal block size, an integer factor greater than or equal to 1 and a plurality of integers giving the maximum number of iterations which can be effected by the said iterative decoding on a block, a submultiple size and a maximum number of iterations such that they are compatible with the said maximum error rate and such that a mean number of iterations which the iterative decoding would carry out on a block of submultiple size is the lowest possible.

Advantageously, for a size which is a submultiple by a given factor k and a given maximum number of iterations, the mean number of iterations is determined according to the signal to noise ratio as the mean value of the number of iterations which would be effected by the iterative decoding for each block of a succession of blocks of submultiple size, the iterations being stopped if the block of submultiple size satisfies a predetermined reliability criterion or if the number of iterations for this block reaches the given maximum number of iterations.

The mean numbers of iterations for different submultiple sizes, different maximum numbers of iterations and different signal to noise ratios are preferably stored in a table which can be updated as the iterative decoding progresses. The mean numbers of iterations will advantageously be chosen by interpolation from values available in the table.

The said search can be limited to the integers which have a value greater than a predetermined value.

According to one embodiment, there is determined, prior to the search, the maximum number of iterations for a normal block size, compatible with a maximum predetermined decoding time, and the search amongst the plurality of submultiple block sizes and the plurality of integers is limited to the values such that the mean number of iterations which would be effected by the iterative decoding on a block of submultiple size is less than the maximum number of iterations.

The invention is also defined by a method of iterative decoding of coded blocks of data, the blocks having an initial size, the method determining an optimum block size and a maximum number of iterations associated with this size by the optimization method disclosed above. The data in a block of initial size having been coded as a sequence of sub-blocks of optimum size, the sub-blocks are decoded, one by one, by a succession of iterations of the iterative decoding, the iterations being stopped for a sub-block if the predetermined reliability criterion is satisfied or if the number of iterations reaches the said maximum number of iterations associated with the said optimum size.

The invention is also defined by a method of iterative decoding of coded blocks of data, the blocks having an initial size, in which there are determined an optimum block size and a maximum number of iterations associated with this size by the optimisation method disclosed above. The data of a block of initial size having been coded as a sequence of sub-blocks of optimum size, the sub-blocks are decoded by successively effecting on each sub-block an iteration of the iterative decoding, an iteration not being carried out for a sub-block if a predetermined reliability criterion is satisfied or if the number of iterations reaches the maximum number of iterations associated with the said optimum size.

The invention concerns a device for the iterative decoding of blocks of data coded by a turbocoder having means for implementing the optimization method defined above, the means supplying an optimum block size and a maximum number of iterations per block of optimum size, the device also comprising means for transmitting optimum block size information to the turbocoder.

The invention also concerns a coding/decoding system comprising a turbocoder adapted to code blocks of data and an iterative decoding device defined above, adapted to decode the blocks of data coded by the turbocoder, the latter comprising means for receiving the said optimum block size information and for modifying the size of at least one internal interleaver according to the said received information.

The invention also concerns a device for coding blocks of data, having means for implementing the optimization method defined above, the means supplying an optimum block size, the device also comprising means for adaptively modifying the size of the blocks of coded data according to the optimum block size.

Finally, the invention concerns a device for the turboequalisation of blocks of data coded by a coder and modulated, having means for implementing the optimisation method defined above, the said means supplying an optimum block size, the said device also comprising means for transmitting optimum block size information to the coder.

The characteristics of the invention mentioned above, as well as others, will emerge more clearly from a reading of the following description of an example embodiment. the said description being given in relation to the accompanying drawings, amongst which:

FIG. 1b illustrates schematically an example of a turbodecoder, with a known structure, adapted to decode data coded by the turbocoder of FIG. 1a;

Figure 4:
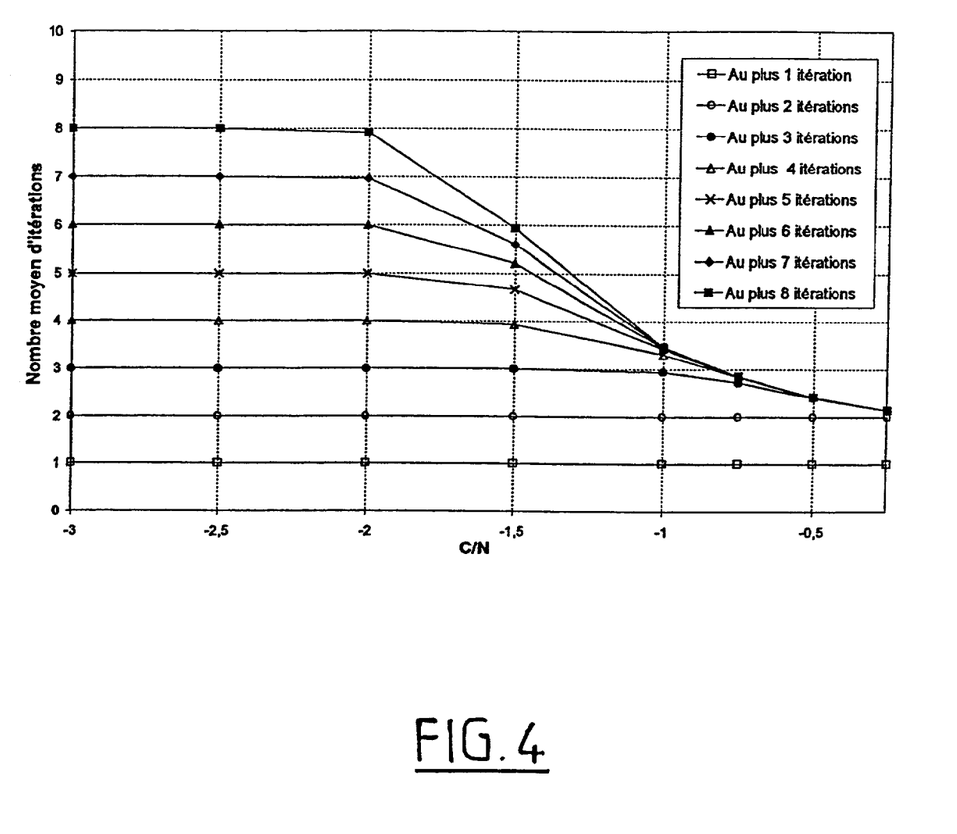
FIG. 4 shows the mean number of iterations of the turbodecoder of FIG. 1b for a given maximum number of iterations and when a perfect stoppage criterion is used.

The general idea at the basis of the invention is to take advantage of the fact that, in an iterative decoder, for a predetermined number of iterations $n_{iterations}$, which will be referred to as the set number, the block can be entirely decoded before the last iteration planned. For example, if the iteration stoppage criterion is a perfect criterion (zero BET, that is to say with the complete absence of errors in the block, the mean number of iterations, $\bar{n}_{iteration}$, is often less than the set number, as can be seen in FIG. 4. This figure shows the change in $\bar{n}_{iteration}$ according to the signal to noise ratio for different values of $n_{iterations}$. It can be seen that, for a given number $n_{iterations}$, the mean number of iterations does not attain this value, all the more so when the signal to noise ratio is high. Naturally, in practice, there is no perfect stoppage criterion: the absence of errors is simply tested, for example by means of a CRC, and the iterations are stopped as soon as the CRC no longer detects any errors. The conclusions concerning the change in $\bar{n}_{iterations}$ with respect to $n_{iterations}$ do however remain valid.

Figure 5:
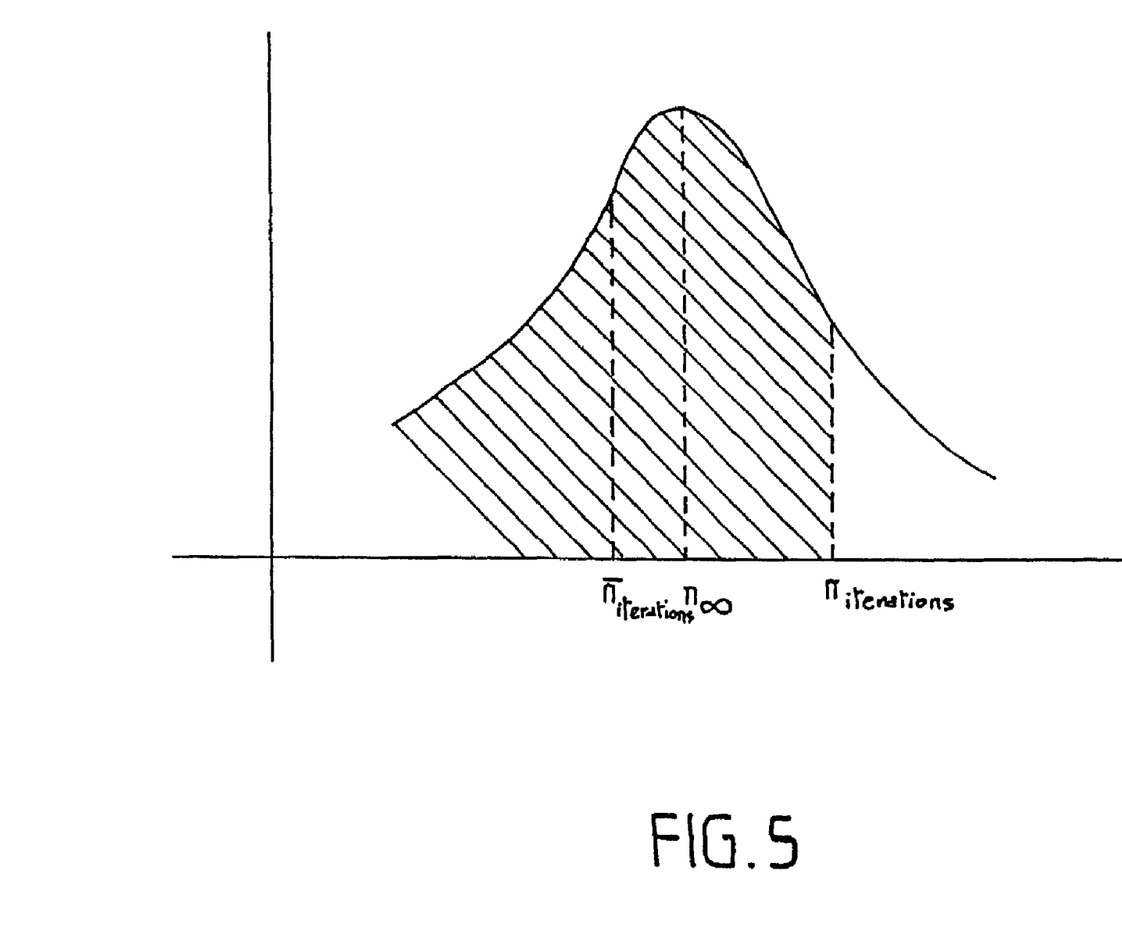
FIG. 5 depicts a histogram of the number of iterations necessary for satisfying a perfect stoppage criterion.

FIG. 5 shows schematically a histogram of the number of iterations necessary for obtaining a zero BET (and therefore PET). As, in practice, it is not possible to effect an infinite number of iterations, there is fixed, as seen above, a set number of iterations $n_{iterations}$ compatible with the latency time and the size of the interleaver according to (1) is derived therefrom. The mean $\bar{n}_\infty$ of the histogram corresponds to an infinite set number. For a given set $n_{iterations}$, the mean value $\bar{n}_{iterations}$ is taken on the hatched area of the curve.

Let it be assumed that there is given a set latency time T and that there has been determined a pair of values $(n_{iterations}, N)$ satisfying $T_{latency} \leq T$ where $T_{latency}$ is given by (1). $n_{iterations}$ and $T_{latency}$ will hereinafter be denoted respectively $n_{iterations}^{(I)}$ and $T_{latency}^{(I)}$.

Let it be assumed now that the size N of the block, and therefore the size of the internal interleaver of the turbocoder or of the turboequaliser, is divided by a non-zero integer k. The latency time $T_{latency}^{(k)}$ at the end of which the k blocks of reduced size N/k are decoded is then expressed as:

$$T_{latency}^{(k)} = T_{rec}^{(k)} + \sum_{i=1}^{k} \frac{N/k}{D_d} \cdot n_{iterations}(i) = T_{rec}^{(k)} + \frac{N}{D_d} \cdot \bar{n}_{iterations}^{(k)} \quad (2)$$

where $T_{rec}^{(k)}$ is a reception time at the end of which the k blocks of size N/k are available, where applicable in interleaved form, at the receiver. In the absence of channel interleaving, this reception time is equal to $$\frac{N}{k \cdot D_u} + \sum_{i=2}^{k} \delta t_{rec}^{(i)}$$

where $N/k.D_u$ is the reception time of the $1^{st}$ block of size N/k and $\delta \& t_{rec}^{(i)}$ is the time which the receiver must wait between the end of the decoding of the (i−1)th block and the end of the reception of the $i^{th}$ block. Consequently this gives:

$$\frac{N}{k \cdot D_u} \leq T_{rec}^{(k)} < \frac{N}{D_u}.$$

On the other hand, when a channel interleaving of size $M_k$ with $M_k \geq N/k$ has been applied at the transmitter, this gives:

$$T_{rec}^{(k)} = M_k/D_u + \sum_{i=2}^{N/M_k} \delta_{rec}^{(i)}$$

where $\delta_{rec}^{(i)}$ is the waiting time between the end of the deinterleaving of the $(i-1)^{th}$ group of $k.M_k/N$ blocks and their decoding on the one hand and the end of reception of the $i^{th}$ group on the other hand. In practice, $M_k=N$ will be taken and therefore $T_{rec}^{(k)}=M_k/D_u$.

$n_{iteration}(i)$ is the number of iterations effected by the decoder on the $i^{th}$ block of size N/k using a predetermined stoppage criterion and for a given set number of iterations $n_{iterations}^{(k)}$;

$\bar{n}_{iteration}^{(k)}$ is the mean number of iterations, taken on the set of k blocks. It should be noted that $\bar{n}_{iteration}^{(k)}$ in general depends on the set number $n_{iterations}^{(k)}$ chosen for the block size N/k and on the signal to noise ratio. Hereinafter the term (N/k, $n_{iterations}^{(k)}$) will be used for a turbocode operating on blocks of size N/k and decoded by means of at most $n^{iterations(k)}$ per block.

It should first of all be noted that, in general, the size $M_k$ of the channel interleaving decreases (in the broad sense) with k, and therefore $T_{rec}^{(k)}$ is a decreasing function of k: $T_{rec}^{(k+1)} \leq T_{rec}^{(k)}$ whether or not a channel interleaving is applied.

It should also be noted that the stoppage criterion can tolerate a predetermined residual error rate. Use can also be made, as mentioned above, of a stoppage criterion operating on a weighted output or outputs or extrinsic information and the stoppage of the iterations can be triggered when a predetermined reliability threshold is reached. In all cases, the stoppage criterion relates to the reliability of the blocks of decoded data and for this reason will also be referred to as the reliability criterion. The stoppage criterion used is chosen so as to be identical for all values of k.

The invention is based on the fact that, the iterative decoding process generally converging before reaching the maximum set number of iterations, it is possible to find an integer k, a set number $n_{iterations}^{(k)}$ such that the mean number of iterations $\bar{n}_{iteration}^{(k)}$ is such that $\bar{n}^{iteration(k)} < n_{iterations}^{(l)}$ and therefore necessarily $T_{latency}^{(l)} < T_{latency}^{(l)}$.

Figure 6:
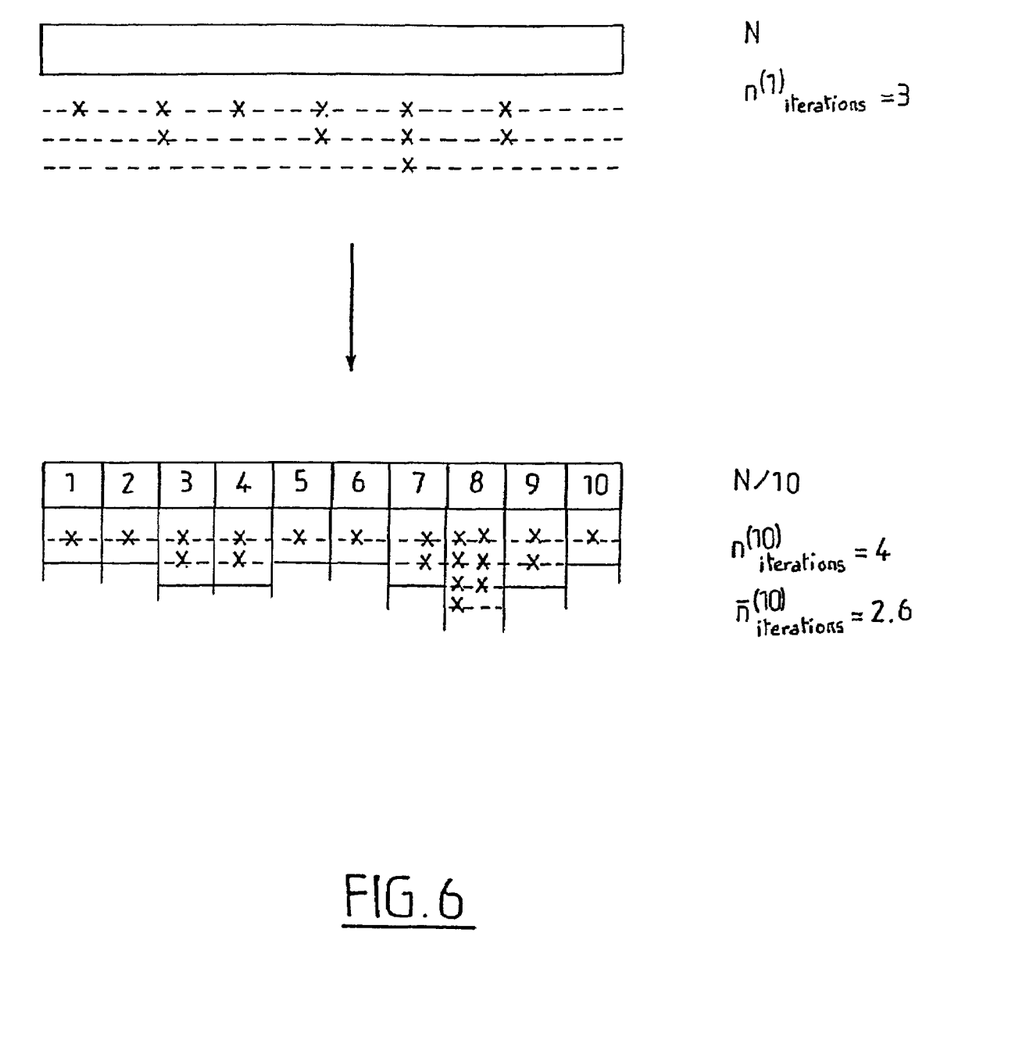
FIG. 6 illustrates the advantage of the averaging of the number of iterations resulting from the present invention.

The comparison between the two situations is illustrated in FIG. 6. An iteration is shown by a horizontal line extending over the length of the block. The line is dotted if there remain errors after the iteration and solid in the contrary case. The location of the errors is indicated symbolically by crosses. The top part of the figure illustrates the process of iterative decoding on a block of size N and for a set number $n_{iterations}^{(l)}=3$ of iterations, satisfying the latency constraint $3N/D_d \leq T$ (it is assumed in order to simplify that there is no channel interleaving and that the reception time is zero). The iterative process has not converged at the end of the 3$^{rd}$ iteration and the decoded block has a residual error. The bottom part of the figure illustrates the situation when the size of the block is divided by 10. The set number $n^{iterations(10)}$ has been chosen so as to be equal to 4. It can be seen that, for the great majority of blocks, the iterative process converges before four and even before three iterations. In this example, only block No. 8 still has an error at the end of the 4$^{th}$ iteration. For an identical error rate, there is thus a change from a latency time $3N/D_d$ to a latency time of $2.6N/D_d$.

In general terms, the choice of a factor k and of a number of iterations $n_{iterations}^{(k)}$ makes it possible to pass from a latency time $T_{latency}^{(l)}$ to a shorter latency time $T_{latency}^{(k)}$ whilst meeting a given performance constraint. There is then sought, amongst the values of k and $n_{iterations}^{(k)}$, the pair of values which makes it possible to obtain the shortest possible latency time $T_{latency}^{(l)}$. The value of k adopted must be sufficiently great to put the averaging of the latency times on k blocks of reduced size N/k.

Figure 7:
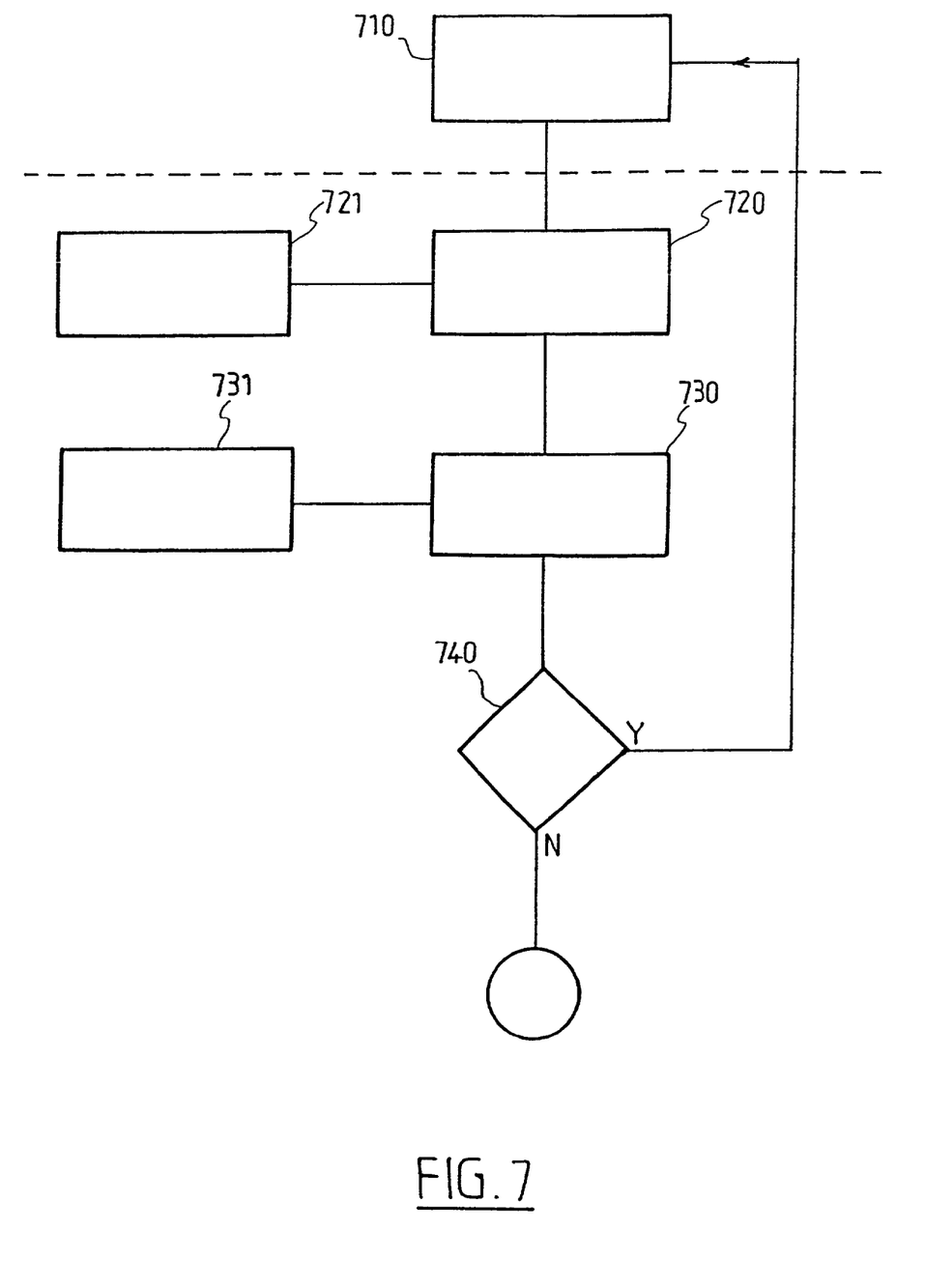
FIG. 7 depicts a flow diagram of the method of determining the optimum block size according to a first embodiment of the invention.

FIG. 7 gives schematically a flow diagram of the method of optimising the block size under the constraint of performance according to a first embodiment of the invention. The transmission shown at 710 uses an internal interleaving length and a block size N. On reception, there is determined at 720, from N and an estimation 721 of the maximum latency time T, the maximum number of iterations $n_{iterations}^{(l)}$ by means of equation (1). In a second step 730, the system next selects, within a table 731, the values of k ($k \geq 1$ and a divisor of N) and $n_{iterations}^{(k)}$ compatible with the performance level (BET, PET) required, having regard to the signal to noise ratio. According to a variant of the invention, when a channel interleaving of fixed size is used ($T_{rec}^{(k)}$ is therefore a constant), the search is limited in advance to the values k and $n_{iterations}^{(k)}$ such that $\bar{n}_{iteration}^{(k)} < n_{iterations}^{(l)}$. There is then determined, at 730, amongst the values selected, the pair (k, $n_{iterations}^{(k)}$) giving the shortest latency time $T_{latency}^{(l)}$.

It is tested at 740 whether the value of k adopted is greater than a value $k_{min}$, necessary for the averaging of the latency time. In the affirmative, the value of k and therefore the new block size N/k is transmitted to the transmitter by a return channel. The turbocoder then adapts the size of the blocks and the size of its internal interleaver or interleavers according to this new value. In the negative, the optimisation process is terminated and the block size remains unchanged.

As an alternative to the embodiment depicted, the test 740 is not carried out and the search in the table 731 is limited to the values of k greater than $k_{min}$.

The table 731 can be produced in advance or after the event from the performance obtained and the actual numbers of iterations. It can also be produced in advance and completed as the system is used. The unavailable values in the tables can be calculated by interpolation from the existing values.

According to a second embodiment of the invention, the block size optimisation process is effected at the transmitter and the system does not have any return channel between the receiver and the transmitter. The block size is modified at the transmitter and the maximum number of iterations per block is reduced as far as possible at the receiver, subject to the constraint of a maximum error rate at the output of the iterative decoding. In this way a mean number of iterations is obtained and therefore a receiver latency time which is reduced to the maximum possible extent.

Whatever the embodiment, when the size N of the block has been divided by a factor k, the iterative process can be effected in two possible ways.

According to a first variant, the 1$^{st}$ decoding iteration is effected for each of the k blocks, and then the 2$^{nd}$ decoding iteration is effected for the blocks with residual errors after the 1$^{st}$ iteration and so on until the available resource or the time allotted for the decoding of the k blocks is exhausted. At each pass the blocks having residual errors are identified by means of the stoppage criterion. In this way, it is certain that the available resource or the allotted latency will be used in an optimum fashion and "lingering" too long on the decoding of a block, which could be prejudicial to the following blocks if k is not sufficiently large to ensure sufficient averaging of the number of iterations, is avoided.

In the case of the example in FIG. 6, the implementation of this variant would be as follows:

1—Iteration #1 for blocks 1 to 10

2—Iteration #2 for blocks 1 to 10 →blocks 1, 2, 5, 6, 10 correct

3—Iteration #3 for blocks 3, 4, 7, 8, 9 →blocks 3, 4, 7, 9 correct

4—Iteration #4 for block 8

This first decoding variant is advantageous when the duration of interleaving of the channel $T_{rec}^{(k)}=M_k/D_u$ is fixed or when k is small. This is because in the first case it is necessary in any event to await for the time $M_k/D_u$ before being able to decode a block and in the second case it makes it possible to remedy any averaging defect.

According to a second variant, each of the k=10 blocks is decoded successively. At a maximum $n_{iterations}^{(10)}=4$ decoding iterations are effected successively on each block using the stoppage criteria in order to obtain $\bar{n}_{iteration}^{(10)}=2.6$ iterations per block on average over all the 10 blocks.

In the case of the example in FIG. 6, the implementation of this variant would be as follows:

1. iterations 1 to 2 for block 1
2. iterations 1 to 2 for block 2
3. iterations 1 to 3 for block 3
4. iterations 1 to 3 for block 4
5. iterations 1 to 2 for block 5
6. iterations 1 to 2 for block 6
7. iterations 1 to 3 for block 7
8. iterations 1 to $n_{iterations}^{(10)}=4$ for block 8
9. iterations 1 to 3 for block 9
10. iterations 1 to 2 for block 10

This second variant is advantageous when the channel interleaving time $T_{rec}^{(k)}=M_k/D^u$ is not fixed or when k is large. This is because, if the time $M_k/D^u$ is not fixed, it can be reduced, possibly at the cost of a loss of performance, to a value corresponding to an interleaving on k'<k consecutive blocks of size k/N. As a result the latency time $T_{latency}^{(k)}$ given by (2) can also be reduced.

It is essential to note that the maximum latency time essentially concerned up to now is only one example of an available resource for effecting the iterative decoding. Resource can also mean the energy expended by a processor, itself a function of the number of iterations. In more general terms, available resource will mean an additive physical quantity liable to be expended by the iterative decoding.

Although the description of the invention has been essentially illustrated as a process of optimising the size of turbocoded blocks under the constraint of performance, it also applies, in a similar fashion, to a process of optimising the size of turboequalised blocks under the constraint of performance, whether this optimisation is carried out at the turboequaliser (the first embodiment) or at the transmitter (the second embodiment).

The invention claimed is:

1. A method of optimizing a size of coded data blocks intended to be subjected to an iterative decoding process, comprising:
   selecting a maximum acceptable error rate of the iterative decoding process;
   receiving, at a receiver, coded data sent by a transmitter; and
   determining, prior to performing the decoding process, but after receiving the received coded data, and based on the selected maximum acceptable error rate, (1) a submultiple block size among a plurality of integer block sizes N/k, which are submultiples of an integer block size N by an integer factor k greater than or equal to 1, wherein k is a factor of N; and (2) a maximum number of iterations among a plurality of integers corresponding to a maximum number of iterations to be applied by the iterative decoding process on a coded data block of the submultiple block size, such that a mean number of iterations that will be applied by the iterative decoding process on the submultiple block size is minimized,
   wherein the submultiple block size and the maximum number of iterations are determined together prior to performing the iterative decoding process.

2. The optimization method according to claim 1, wherein the mean number of iterations is determined as a function of a signal-to-noise ratio as the mean value of the number of iterations that will be applied by the iterative decoding process for each block in a succession of blocks of said submultiple size, the iterations being stopped (1) if the block of said submultiple size satisfies a predetermined reliability criterion, or (2) if the number of iterations for the block attains the given maximum number of iterations.

3. The optimization method according to claim 1, wherein mean numbers of iterations for different submultiple sizes, different maximum numbers of iterations, and different signal-to-noise ratios are stored in a table.

4. The optimization method according to claim 3, wherein the table is updated based on results of the iterative decoding process.

5. The optimization method according to claim 3, wherein the mean numbers of iterations are obtained by interpolation from values available in the table.

6. The optimization method according to claim 1, wherein the determining step comprises:
   determining the integer factor k among integers that have a value higher than a predetermined value $k_{min}$.

7. The optimization method according to claim 1, wherein the determining step comprises:
   determining the maximum number of iterations compatible with a predetermined maximum decoding time, wherein a search among said plurality of submultiple block sizes N/k and said plurality of integers is limited to values such that the mean number of iterations that will be applied by the iterative decoding process on a block of said submultiple size is less than said maximum number of iterations.

8. The method of claim 1, further comprising:
   partitioning the coded data of a block of initial size as a sequence of sub-blocks of the submultiple block size; and
   decoding the sub-blocks, one by one, by a succession of iterations of the iterative decoding process, the iterations being stopped for one of the sequence of sub-blocks if (1) a predetermined reliability criterion is satisfied, or (2) if the number of iterations attains the maximum number of iterations associated with the submultiple block size.

9. The method of claim 1, further comprising:
   partitioning the coded data of a block of initial size as a sequence of sub-blocks of the submultiple block size; and
   decoding the sub-blocks by successively applying, on each sub-block, an iteration of the iterative decoding process, the iteration not being applied for a sub-block (1) if a predetermined reliability criterion is satisfied, or (2) if the number of iterations reaches the maximum number of iterations associated with the submultiple block size.

10. A device for an iterative decoding of blocks of data coded by a turbocoder, comprising:
   means for selecting a maximum acceptable error rate of the iterative decoding process;
   a processor configured to determine, prior to performing a decoding process, but after receiving coded data, and based on the selected maximum acceptable error rate, (1) a submultiple block size among a plurality of integer block sizes N/k, which are submultiples of an integer block size N by an integer factor k greater than or equal to 1, wherein k is a factor of N; and (2) a maximum number of iterations among a plurality of integers corresponding to a maximum number of iterations to be applied by the iterative decoding process on a coded data block of the submultiple block size, such that a mean number of iterations that will be applied by the iterative decoding process on the submultiple block size is minimized; and means for transmitting the optimum block size to the turbocoder, wherein the processor is configured to determine the submultiple block size and the maximum number of iterations together prior to performing the iterative decoding process.

11. A coding/decoding system, comprising:

a turbocoder configured to code blocks of data; and an iterative decoding device configured to decode the blocks of data coded by the turbocoder, the iterative coding device comprising:

means for selecting a maximum acceptable error rate of the iterative decoding process;

a processor configured to determine, prior to performing a decoding process, but after receiving coded data, and based on the selected maximum acceptable error rate, (1) a submultiple block size among a plurality of integer block sizes N/k, which are submultiples of an integer block size N by an integer factor k greater than or equal to 1, wherein k is a factor of N; and (2) a maximum number of iterations among a plurality of integers corresponding to a maximum number of iterations to be applied by the iterative decoding process on a coded data block of the submultiple block size, such that a mean number of iterations that will be applied by the iterative decoding process on the submultiple block size is minimized, wherein the processor is configured to determine the submultiple block size and the maximum number of iterations together prior to performing the iterative decoding process; and means for transmitting the optimum block size to the turbocoder;

means for receiving the optimum block size and for modifying the size of at least one internal interleaver according to the received optimum block size.

12. A turbocoding device for coding blocks of data, comprising:

means for selecting a maximum acceptable error rate of the iterative decoding process;

a processor configured to determine, prior to performing a decoding process and based on the selected maximum acceptable error rate, (1) a submultiple block size among a plurality of integer block sizes N/k, which are submultiples of an integer block size N by an integer factor k greater than or equal to 1, wherein k is a factor of N; and (2) a maximum number of iterations among a plurality of integers corresponding to a maximum number of iterations to be applied by the iterative decoding process on a coded data block, such that a mean number of iterations that will be applied by the iterative decoding process on the submultiple block size is minimized, wherein the processor is configured to determine the submultiple block size and the maximum number of iterations together prior to performing the iterative decoding process; and means for adaptively modifying the size of the coded data blocks according to said optimum block size.

13. A device for turboequalisation of blocks of data coded by a coder and modulated, comprising:

means for selecting a maximum acceptable error rate of the iterative decoding process;

a processor configured to determine, prior to performing a decoding process, but after receiving coded data, and based on the selected maximum acceptable error rate, (1) a submultiple block size among a plurality of integer block sizes N/k, which are submultiples of an integer block size N by an integer factor k greater than or equal to 1, wherein k is a factor of N; and (2) a maximum number of iterations among a plurality of integers corresponding to a maximum number of iterations to be applied by the iterative decoding process on a coded data block, such that a mean number of iterations that will be applied by the iterative decoding process on the submultiple block size is minimized, wherein the processor is configured to determine the submultiple block size and the maximum number of iterations together prior to performing the iterative decoding process; and means for transmitting the optimum block size to the coder.

* * * * *